United States Patent
Singh et al.

(10) Patent No.: US 8,120,385 B2
(45) Date of Patent: Feb. 21, 2012

(54) REDUCTION IN KICKBACK EFFECT IN COMPARATORS

(75) Inventors: Pratap Singh, Uttar Pradesh (IN); Chandrajit Debnath, Greater Noida (IN)

(73) Assignee: ST-Ericsson SA, Geneva (CH)

( * ) Notice: Subject to any disclaimer, the term of this patent is extended or adjusted under 35 U.S.C. 154(b) by 30 days.

(21) Appl. No.: 12/512,824

(22) Filed: Jul. 30, 2009

(65) Prior Publication Data

US 2011/0032136 A1 Feb. 10, 2011

(30) Foreign Application Priority Data

Jun. 17, 2009 (IN) .......................... 2773/DEL/2008

(51) Int. Cl.
*G01R 19/00* (2006.01)
(52) U.S. Cl. ............. 327/55; 327/57; 327/212; 327/215

(58) Field of Classification Search ................ 327/55, 327/57, 211–212, 214–215
See application file for complete search history.

(56) References Cited

U.S. PATENT DOCUMENTS

| | | | | |
|---|---|---|---|---|
| 4,714,895 A * | 12/1987 | Nicollini et al. | ............... | 330/258 |
| 5,838,200 A * | 11/1998 | Opris | ............................ | 330/258 |
| 5,847,601 A * | 12/1998 | Wang | .................................... | 330/9 |
| 5,847,607 A * | 12/1998 | Lewicki et al. | ............... | 330/258 |
| 6,400,301 B1 * | 6/2002 | Kulhalli et al. | ............... | 341/155 |
| 7,253,686 B2 * | 8/2007 | Ali | ................ | 330/259 |

* cited by examiner

*Primary Examiner* — Kenneth B. Wells
(74) *Attorney, Agent, or Firm* — Hogan Lovells US LLP

(57) ABSTRACT

The present disclosure relates to reduction in the effect of kickback in comparators by means of charge injection implemented by means of voltage controlled switches with attributes similar to those of an input differential pair. The voltage controlled switches produce charge to neutralize the charge loss during latching of inputs in the comparator.

6 Claims, 6 Drawing Sheets

REDUCTION IN KICKBACK EFFECT IN COMPARATORS

RELATED APPLICATION

The present application claims priority of Indian Provisional Patent Application No. 2773/Del/2008 filed Dec. 6, 2008 and of Indian Complete (non-provisional) Application No. 2773/Del/2008 filed Jun. 17, 2009, which are incorporated herein in their entireties by this reference.

FIELD OF THE INVENTION

The present disclosure relates to comparators and more specifically to reduced effect of kickback in comparators by means of charge injection.

BACKGROUND

Comparators are the basic building blocks for many circuits such as analog to digital converters, semiconductor memories and PLLs. As is known in the art, a comparator compares the input voltage with a reference voltage and switches its output to indicate the higher voltage. A comparator circuit typically comprises an input pair of voltage controlled switches such as transistors driven by an input voltage driver and a corresponding reference voltage input pair of voltage controlled switches such as transistors driven by a reference voltage driver.

However, when the comparator starts latching an input, there is a large voltage variation across the source and drain voltage controlled switches. This variation in voltage is "kicked back" to the input of the comparator through parasitic, i.e., coupling capacitances of said switches. Also as the input voltage driver or reference voltage driver do not have zero output impedance, the input voltage of the comparator changes and the accuracy of the comparator reduces.

SUMMARY OF THE INVENTION

According to the present invention, the effect of kickback of the input voltage is reduced using a preamplifier ahead of comparison by the comparator, which entails inclusion of a DC bias current in the comparator circuit.

The present disclosure relates to a system comprising a comparator comprising a first and second voltage controlled unit coupled to an input and reference voltage controlled switches respectively. The attributes of the voltage controlled units are similar to those of the input differential pair of the comparator. When the input differential pair latches inputs so as to provide an output, a charge is produced across the same owing to the coupling capacitances of the differential pair. The voltage controlled units in turn produce equivalent charge which neutralizes the charge produced across the input differential pair and therefore, the output of the comparator is accurate.

Another embodiment of the present disclosure describes an analog to digital converter comprising a comparator. The analog to digital converter comprises a first and second voltage controlled units, which are coupled to the input and reference voltage controlled switches of the comparator. The voltage controlled units have similar attributes as the input differential pair of the comparator. When, the input differential pair latches inputs so as to provide an output, charge is produced across the input differential pair owing to the coupling capacitances of the same. However, the voltage controlled units produce an equivalent charge, which in turn neutralizes the charge produced by the coupling capacitances thereby, reducing the kickback and providing an accurate output.

BRIEF DESCRIPTION OF DRAWINGS

These and other features and aspects of the various embodiments of the disclosure will be better understood when the following detailed description is read with reference to the accompanying drawings in which like characters represent like parts throughout the drawings.

DETAILED DESCRIPTION

Figure 1:
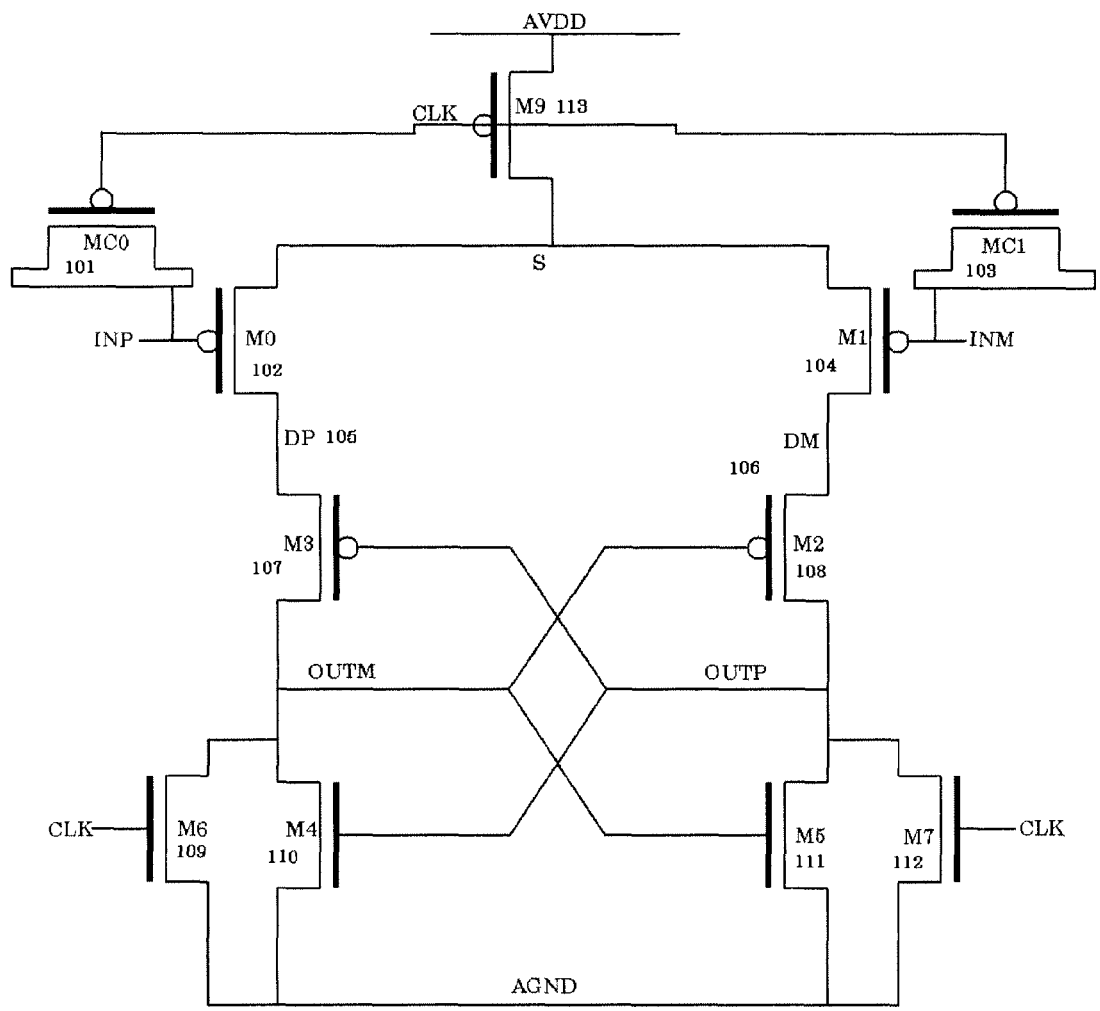
FIG. 1 illustrates a system for reduction in effect of kickback in comparators by charge injection according to an embodiment of the disclosure.

The embodiments of the present disclosure will be described in detail with reference to the accompanying drawings. However, the present disclosure is not limited to these embodiments. The present disclosure can be modified in various forms. The embodiments of the present disclosure described herein are only provided to explain more clearly the present disclosure to the ordinarily skilled in the art. In the accompanying drawings, like reference numerals are used to indicate like components.

The terms 'input voltage controlled switch and reference voltage controlled switch' are hereinafter used interchangeably with 'input differential pair' throughout the disclosure. This is also known in the art as a capacitor-connected transistor.

The present disclosure relates to a system comprising a comparator comprising a first and second voltage controlled unit coupled to an input and reference voltage controlled switches respectively. The attributes of the voltage controlled units are similar to those of the input differential pair of the comparator. When the input differential pair latches inputs so as to provide an output, a charge is produced across the same owing to the coupling capacitances of the differential pair. The voltage controlled units in turn produce equivalent charge which neutralizes the charge produced across the input differential pair and therefore, the output of the comparator is accurate.

Another embodiment of the present disclosure describes an analog to digital converter 10 comprising a comparator 20. The analog to digital converter comprises a first and second voltage controlled units, which are coupled to the input and reference voltage controlled switches of the comparator. The voltage controlled units have similar attributes as the input differential pair of the comparator. When, the input differential pair latches inputs so as to provide an output, charge is produced across the input differential pair owing to the coupling capacitances of the same. However, the voltage controlled units produce an equivalent charge, which in turn neutralizes the charge produced by the coupling capacitances thereby, reducing the kickback and providing an accurate output.

According to an embodiment of the present disclosure, as is shown in FIG. 1, a first voltage controlled unit MC0 101 is coupled to the input voltage controlled switch M0 102 of the comparator while a second voltage controlled unit MC1 103 is coupled to reference voltage controlled switch M1 104. The voltage controlled units MC0 101 and MC1 103 have attributes similar to the input differential pair of the comparator. For example if the input differential pair comprises PMOS transistors, switches MC0 and MC1 are also PMOS transistors.

When the clock signal CLK goes low, the input and reference voltage controlled switches M0 102, M1 104 start latching inputs and produce some amounts of charge due to their respective coupling capacitances. The voltage controlled units MC0 101 and MC1 103 produce similar amount of charge as produced by input and reference voltage controlled switches M0 102, M1 104. The charge is produced across their respective coupling capacitances, and thus the effect of charge produced by the switches M0 102 and M1 104 is neutralized. The effect of kickback in the comparator circuit is reduced by a factor approximated by the difference of the charge induced by M0 102, M1 104 and MC0 101, MC1 103 on their respective coupling capacitances. When CLK goes high, the circuit moves into the tracking phase where the input differential nodes as well as the voltage controlled units MC0 101 and MC1 103 are charged to the input common mode voltage.

The coupling of voltage controlled units MC0 101 and MC1 103, with similar attributes as the input differential pair, reduces the effect of process variations such as voltage and temperature variations, thus making the system robust.

Figure 2:
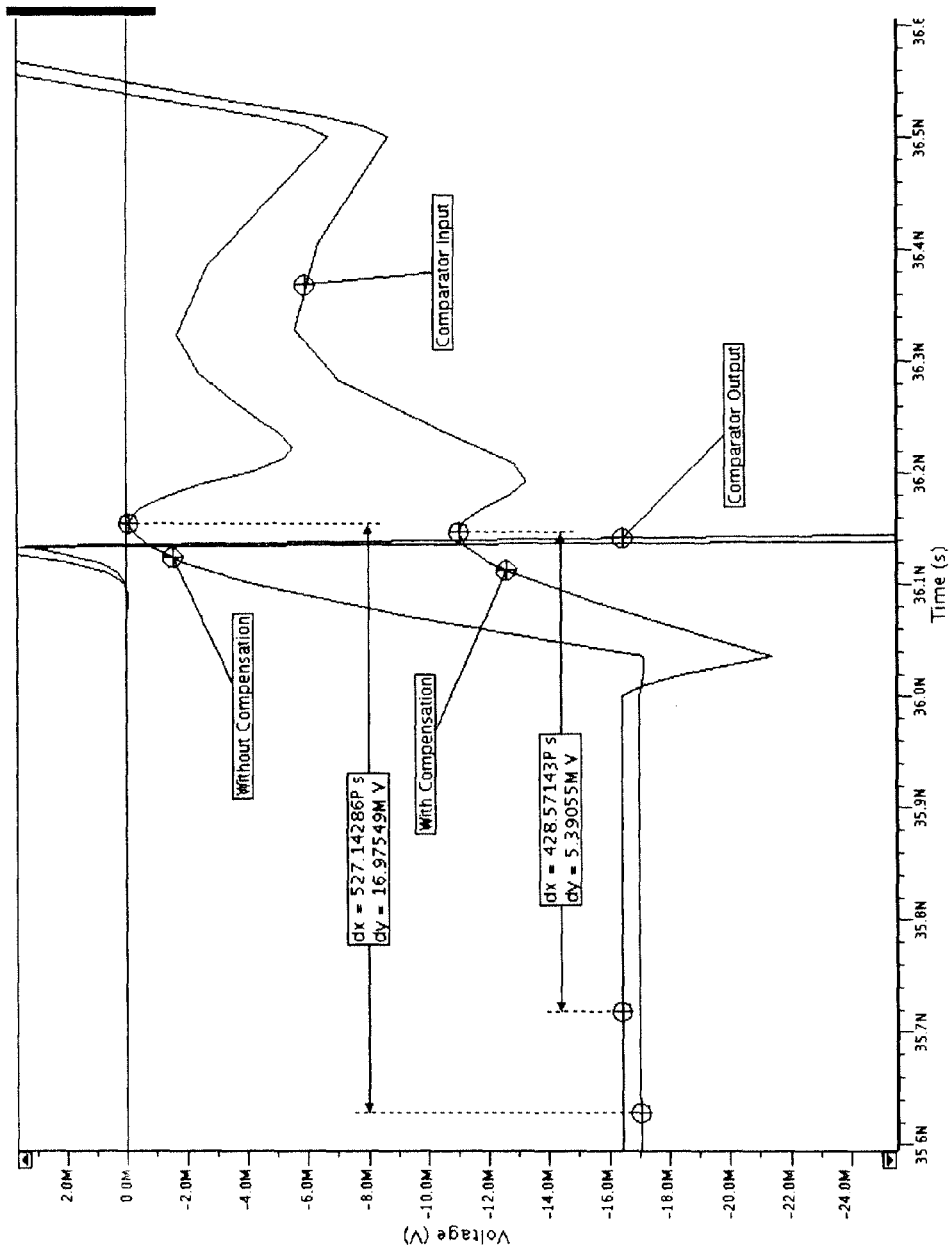
FIG. 2 shows the comparison of the embodiment of the present disclosure described in FIG. 1 with the conventional art.

FIG. 2 shows the comparison of the embodiment of the present disclosure described in FIG. 1 with the conventional art by means of simulation results. First case (without compensation) shows the comparator circuit without neutralization of the kickback effect while the second case (with compensation) shows the comparator circuit with neutralization of kickback effect by coupling voltage controlled units MC0 101 and MC1 103 to the input differential pair. It is seen from FIG. 2 that the effect of kickback is reduced from 16 mV to 5 mV without any requirement for dc bias current.

Figure 3:
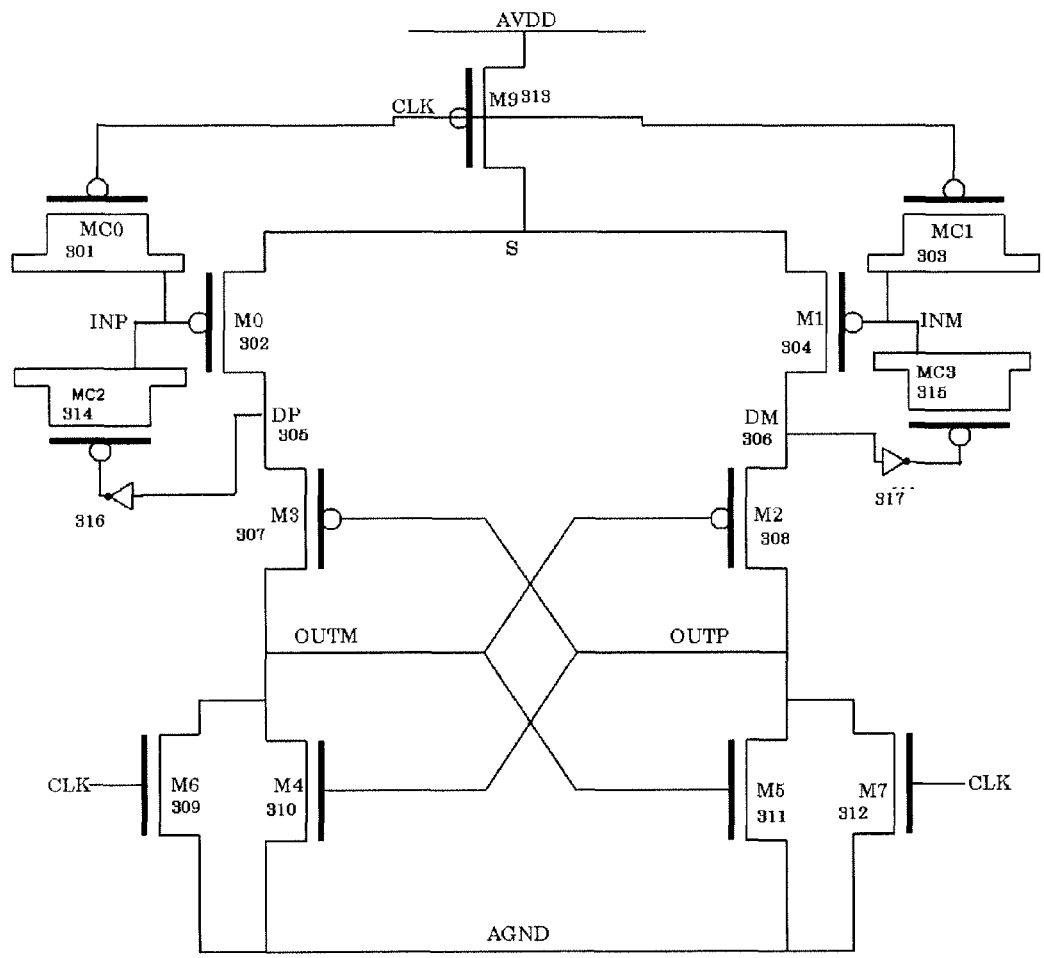
FIG. 3 illustrates a system for reduction in effect of kickback in comparators by closed loop implementation of charge injection in accordance with an embodiment of the present disclosure.

According to another embodiment of the present disclosure, the effect of kickback is further reduced by closed loop implementation of charge injection. FIG. 3 illustrates a system according to the embodiment, where a pair of inverters coupled to a pair of voltage controlled switches is coupled to the input differential pair. As shown in FIG. 3, inverter 316 is coupled to voltage controlled unit MC2 314 and inverter 317 is coupled to voltage controlled unit MC3 315. The inverters 316, 317 provide buffering and minimize loading effect on nodes DP 305 and DM 306, respectively. This lowers charge induction on the respective coupling capacitances, thereby reducing the effect of kickback in comparators.

Similar to the charge injection as illustrated in FIG. 1, voltage controlled units MC2 314 and MC3 315 are of similar attributes as switches M0 302 and M1 304. For example, if the voltage controlled switches M0 302 and M1 304 in the comparator circuit are PMOS, switches MC0 301, MC1 303, MC2 314 and MC3 315 are also PMOS.

According to an embodiment of the disclosure, an NMOS transistor coupled to an inverter is used to function as MC0, MC1, MC2 or MC3. This configuration, however, does not result in effective reduction of kickback due to ineffective matching and synchronization.

Figure 4:
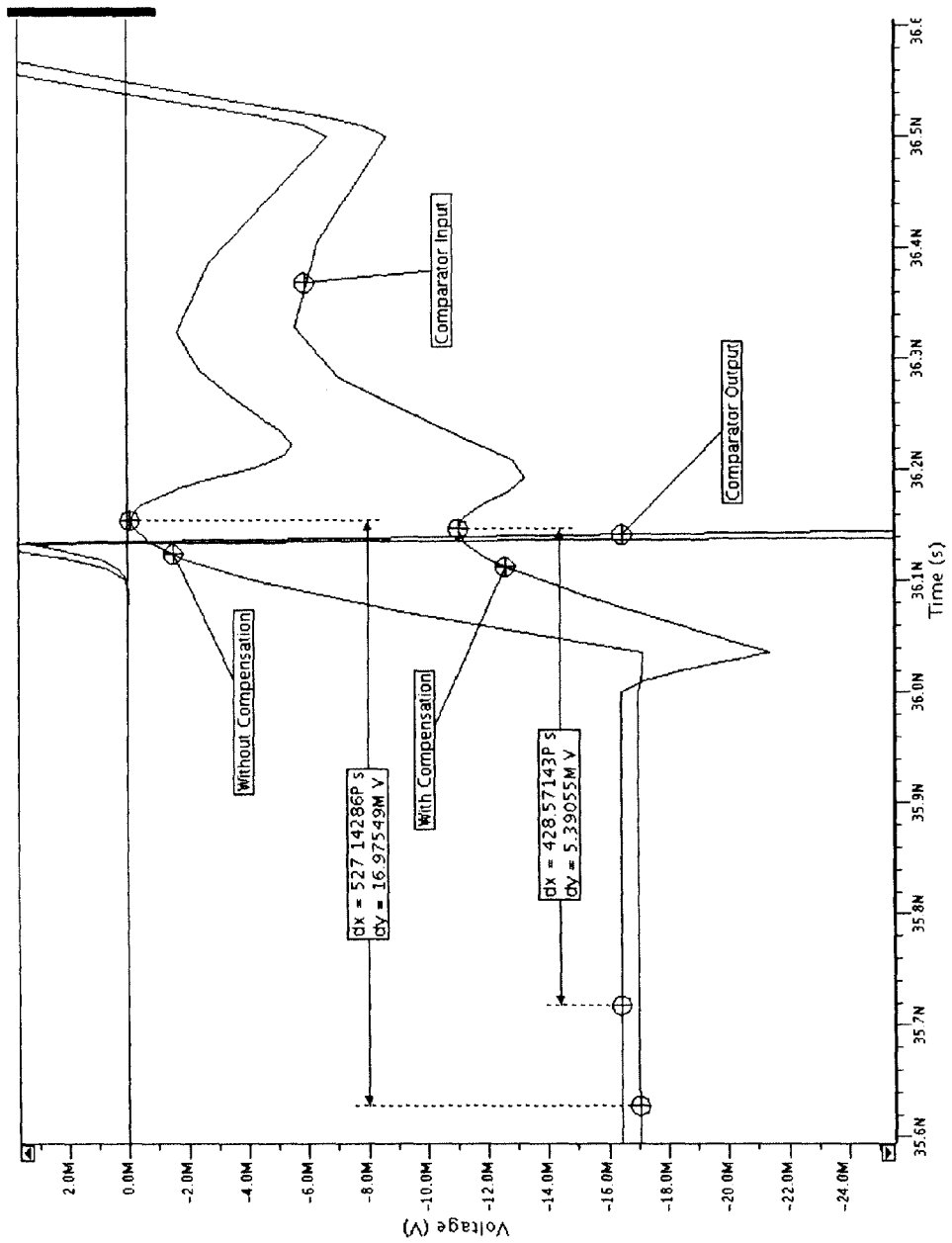
FIG. 4 shows the comparison of the embodiment of the present disclosure described in FIG. 3 with the conventional art.

FIG. 4 shows a comparison of the embodiment of the present disclosure described in FIG. 3 with the conventional art. It shows how a comparator "without compensation" produces a kickback voltage of 16 mV while a comparator with closed loop implementation of charge injection produces a kickback of 5 mV.

Figure 5:
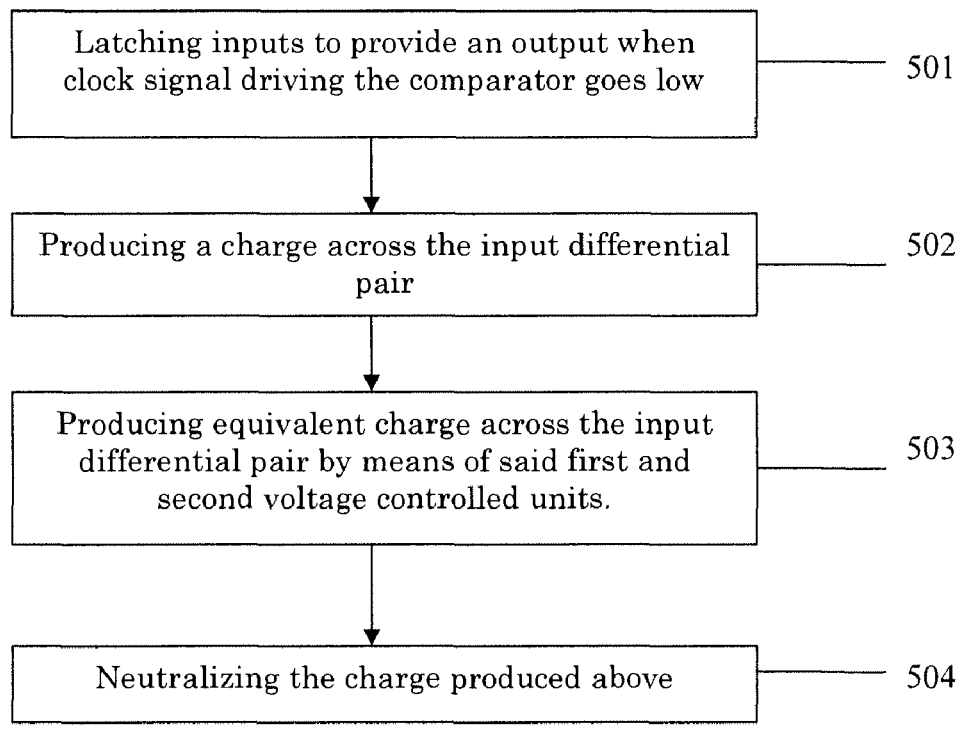
FIG. 5 illustrates a method for reduction of kickback in comparators by means of charge injection according to an embodiment of the present disclosure.

An embodiment of a method for reduction of kickback in a comparator by means of charge injection is illustrated in FIG. 5. The method is illustrated as a collection of blocks in a logical flow graph, which represents a sequence of operations that can be implemented in hardware, software, or a combination thereof. The order in which the process is described is not intended to be construed as a limitation, and any number of the described blocks can be combined in any order to implement the process, or an alternate process.

FIG. 5 illustrates a method for reduction of kickback in comparators by means of charge injection according to an embodiment of the present disclosure. A first voltage controlled unit is coupled to the input voltage controlled switch of the comparator while a second voltage controlled unit is coupled to the reference voltage controlled switch of the comparator. The voltage controlled units coupled across the differential pair have attributes similar to those of the input differential pair. When the clock signal CLK driving the comparator goes low, the comparator begins latching the inputs so as to provide an output 501. This produces a charge across the input differential pair 502 owing to the coupling capacitances of the same. However, the first and second voltage controlled units coupled across the input differential pair produce an equivalent charge across the input differential pair 503 which in turn neutralizes the charge produced during latching of inputs 504.

Figure 6:
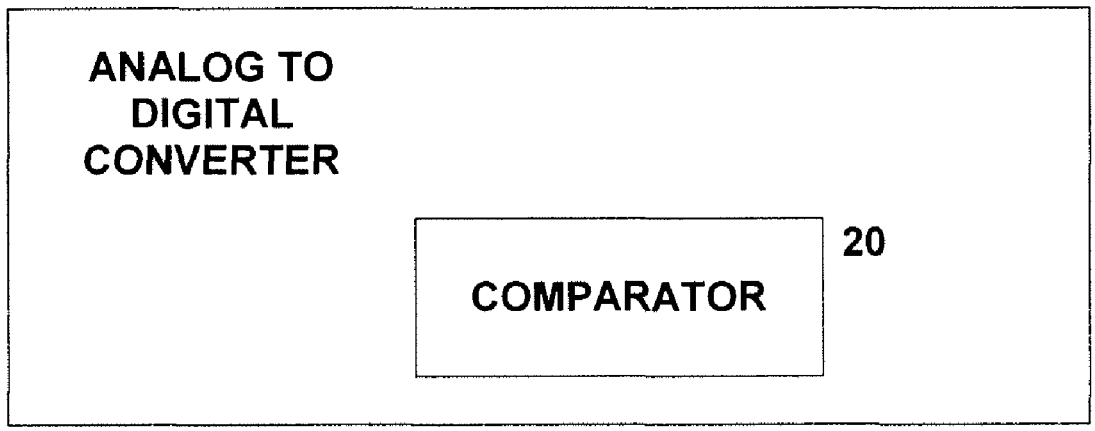
FIG. 6 illustrates a comparator incorporated in an analog to digital converter which incorporates the preferred embodiments shown in FIG. 1 or FIG. 3.

An embodiment shown in FIG. 6 incorporates a comparator 20 as a part of an analog to digital converter 10 of the present invention. In preferred embodiments, comparator 20 incorporates either the circuit shown in FIG. 1 or the circuit shown in FIG. 3.

The various embodiments of the present disclosure do not result in area overhead due to the non requirement of preamplifiers and DC bias current. They are applicable to several analog circuits such as analog to digital converters and PLL.

The disclosure shows and describes only the embodiments of the disclosure; however the disclosure is capable of use in various other combinations, modifications, and environments and is capable of changes or modifications within the scope of the inventive concept as expressed herein, commensurate with the above teachings and/or the skill or knowledge of the relevant art. The embodiments described hereinabove are further intended to explain best modes known of practicing the disclosure and to enable others skilled in the art to utilize the disclosure in such, or other, embodiments and with the various modifications required by the particular applications or uses of the disclosure. Accordingly, the description is not intended to limit the disclosure as disclosed herein. Also, it is intended that the appended claims be construed to include alternative embodiments.

The invention claimed is:

1. A comparator comprising:
   a first transistor having a current path coupled between a source of supply voltage and an intermediate node, and a gate;
   a second transistor having a current path between the intermediate node and a first output node, and a gate forming a first input node;

a third transistor having a current path between the intermediate node and a second output node, and a gate forming a second input node;
a first capacitor coupled between the gate of the first transistor and the gate of the second transistor;
a second capacitor coupled between the gate of the first transistor and the gate of the third transistor;
a third capacitor and a first inverter coupled between the first input node and the first output node; and
a fourth capacitor and a second inverter coupled between the second input node and the second output node.

2. The comparator as in claim 1 wherein the first, second, and third transistors each comprise a P-channel transistor.

3. The comparator as in claim 1 wherein the first and second capacitors comprise capacitor-connected transistors.

4. The comparator as in claim 1 wherein the third and fourth capacitors comprise capacitor-connected transistors.

5. The comparator as in claim 1 wherein the third capacitor and the first inverter are coupled in series.

6. The comparator as in claim 1 wherein the fourth capacitor and the second inverter are coupled in series.

* * * * *